(12) United States Patent
Beccue (10) Patent No.: US 9,209,745 B2
(45) Date of Patent: Dec. 8, 2015

(54) APPARATUS AND METHODS FOR MULTIPHASE OSCILLATORS

(71) Applicant: Analog Devices, Inc., Norwood, MA (US)

(72) Inventor: Stephen Mark Beccue, Thousand Oaks, CA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/137,289

(22) Filed: Dec. 20, 2013

(65) Prior Publication Data

US 2015/0180455 A1    Jun. 25, 2015

(51) Int. Cl.
| | | |
|---|---|---|
| *H03B 5/18* | (2006.01) | |
| *H03K 3/03* | (2006.01) | |
| *H03B 27/00* | (2006.01) | |

(52) U.S. Cl.
CPC .................. *H03B 5/18* (2013.01); *H03B 27/00* (2013.01); *H03K 3/0315* (2013.01); *H03B 2200/0016* (2013.01)

(58) Field of Classification Search
CPC ..... H03K 3/0315; H03K 3/0322; H03B 5/18; H03B 27/00; H03B 2200/0016
USPC ............... 331/45, 46, 50, 55, 56, 57, 99, 104, 331/107 P, 107 DP, 107 R
See application file for complete search history.

(56) References Cited

U.S. PATENT DOCUMENTS

| | | | |
|---|---|---|---|
| 6,249,189 B1 * | 6/2001 | Wu et al. .................. | 331/18 |
| 6,556,089 B2 | 4/2003 | Wood | |
| 7,236,060 B2 | 6/2007 | Wood | |
| 7,683,726 B2 * | 3/2010 | Kim ................................. | 331/57 |
| 2009/0215423 A1 * | 8/2009 | Hwang et al. ................. | 455/334 |
| 2012/0013408 A1 | 1/2012 | Cortadella et al. | |
| 2012/0112841 A1 * | 5/2012 | Hayashi ............................ | 331/2 |
| 2013/0154750 A1 * | 6/2013 | Martchovsky ................ | 331/115 |

FOREIGN PATENT DOCUMENTS

| | | |
|---|---|---|
| JP | 2001-36387 | 2/2001 |
| WO | WO 2006-133225 | 12/2006 |
| WO | WO 2012/094051 A2 | 7/2012 |

OTHER PUBLICATIONS

Extended European Search Report of Apr. 24, 2015 for European Patent Application No. 14197056.6 filed Dec. 9, 2014. 8 pages.
Shima, Takeshi, "CMOS Ring Oscillator Array with Braided Connections," IEEE International 9th New Circuits and Systems Conference, NEWCAS2011, pp. 149-152, Jun. 2011.
Official Action dated Oct. 23, 2015, received in Japanese patent application No. 2014-255968 (4 pages).

* cited by examiner

*Primary Examiner* — Ryan Johnson
(74) *Attorney, Agent, or Firm* — Knobbe Martens Olson & Bear LLP (57) ABSTRACT

Apparatus and methods for multiphase oscillators are provided. In certain implementations, an oscillator system includes a first multiphase oscillator and a second multiphase oscillator that are phase and frequency-locked. Additionally, the first and second multiphase oscillators are phase-locked by an amount of phase shift that provides colocated clock signal phases of relatively wide angular distances, which can be used by the oscillators' amplification circuits. The first and/or second multiphase oscillators include one or more amplification circuits that operate using at least one clock signal phase generated by the first multiphase oscillator and using at least one clock signal phase generated by the second multiphase oscillator.

23 Claims, 7 Drawing Sheets

APPARATUS AND METHODS FOR MULTIPHASE OSCILLATORS

BACKGROUND

1. Field

Embodiments of the invention relate to electronic systems, and more particularly, to multiphase oscillators.

2. Description of the Related Technology

Multiphase oscillators can be used in a variety of applications, including, for example, telecommunications systems, optical networks, radar systems, and/or chip-to-chip communication. For instance, a multiphase oscillator can be used in a frequency synthesizer to generate an output clock signal having a controlled phase and frequency relationship to a reference clock signal.

There is a need for improved multiphase oscillators.

SUMMARY

In one aspect, an apparatus includes a plurality of multiphase oscillators. The plurality of multiphase oscillators includes a first multiphase oscillator configured to generate a first clock signal having a first phase, and a second multiphase oscillator adjacent the first multiphase oscillator and configured to generate a second clock signal having a second phase different than the first phase. The first multiphase oscillator includes a first plurality of amplification circuits. The first clock signal is generated in part using the first plurality of amplification circuits. A phase of the second multiphase oscillator is phase locked to the first multiphase oscillator with a phase shift. A first amplification circuit of the first plurality of amplification circuits is configured to operate at least with the first clock signal generated by the first multiphase clock oscillator and the second clock signal generated by the second multiphase oscillator.

In another aspect, an electronically implemented method of electronic oscillation is provided. The method includes generating a first clock signal having a first phase using a first multiphase oscillator, and generating a second clock signal having a second phase using a second multiphase oscillator. The second phase is different than the first phase, and the first clock signal is generated in part using a first plurality of amplification circuits of the first multiphase oscillator. The method further includes phase locking the second multiphase oscillator to the first multiphase oscillator, the phase locking occurring with a phase shift. The method further includes providing a first amplification circuit of the first plurality of amplification circuits at least with the first clock signal generated by the first multiphase clock oscillator and the second clock signal generated by the second multiphase oscillator.

DETAILED DESCRIPTION OF EMBODIMENTS

The following detailed description of embodiments presents various descriptions of specific embodiments of the invention. However, the invention can be embodied in a multitude of different ways as defined and covered by the claims. In this description, reference is made to the drawings where like reference numerals may indicate identical or functionally similar elements.

A multiphase oscillator can include amplification circuits that operate using multiple clock signal phases. For example, a rotary travelling wave oscillator (RTWO) can include wave regeneration circuits that operate using four or more clock signal phases.

One or more of the clock signal phases used by an amplification circuit may not be located physically near to the amplification circuit. For example, a multiphase oscillator can be implemented using differential signaling, and thus clock signals having phases of about 0 degrees (°) and about 180° may be physically colocated with the amplification circuit. However, other clock signals of relatively wide angular distance relative to the clock signals having phases of about 0° and about 180°, such as quadrature clock signals, can be physically distant from the amplification circuit.

As persons having ordinary skill in the art will appreciate, clock signal phase can represent a fraction of a complete clock signal cycle elapsed as measured from a specified reference point. For clarity of the description, a clock signal phase local to a certain amplification circuit may be referred to herein as having a phase of about 0°. However, skilled artisans will appreciate that clock signal phase can be defined relative to other reference points.

Although long wires can be used to route distant clock signal phases to an amplification circuit, long wires can also cause losses that reduce the oscillator's Q-factor and/or otherwise degrade the oscillator's performance.

Clock signal phases of wide angular distance can be provided to an oscillator's amplification circuits by implementing the oscillator using certain circuit layouts. For example, an RTWO can be implemented using a differential transmission line that circles back on itself one or more times to provide four or more colocated clock signal phases as described in commonly-owned U.S. Pat. No. 6,556,089, issued Apr. 29, 2003, and titled "ELECTRONIC CIRCUITRY," which is hereby incorporated by reference in its entirety herein. Although implementing a multiphase oscillator with a particular layout may colocate certain clock signal phases, implementing the multiphase oscillator in this manner can also reduce the oscillator's Q-factor and/or lower the oscillator's figure of merit (FOM).

In view of the difficulty in providing clock signals of certain phases to an oscillator's amplification circuits, certain oscillators may avoid using amplification circuits that operate using clock signal phases that are separated by relatively wide angular distances. For example, some oscillators may include amplification circuits that operate using only a locally available differential clock signal. However, constraining an oscillator's implementation in this manner can decrease FOM, lower Q-factor, and/or increase phase noise relative to a configuration using amplification circuits that operate with additional clock signal phases and/or clock signal phases of wide angular distance relative to the locally available differential clock signal.

Provided herein are apparatus and methods for multiphase oscillators. In certain configurations, an oscillator system includes two or more adjacent multiphase oscillators that are locked in frequency and phase. Additionally, the multiphase oscillators are phase-locked with an amount of phase shift that provides colocated clock signal phases of relatively wide angular distances, which can be used by the oscillators' amplification circuits. For example, a first multiphase oscillator can generate clock signals having phases of about 0° and about 180°, and a second multiphase oscillator that is physically adjacent and phase-locked to the first multiphase oscillator can generate colocated clock signals having phases of relatively wide angular distance relative to the 0° and 180° clock signals. For instance, in certain implementations, the second multiphase oscillator is phase-locked to the first multiphase oscillator by a phase shift θ, and the second multiphase oscillator can generate colocated clock signal phases of about $(0+θ)°$ and about $(180+θ)°$. The first multiphase oscillator can include at least one amplification circuit that operates using at least one clock signal phase generated by the first multiphase oscillator and with at least one clock signal phase generated by the second multiphase oscillator.

Accordingly, the teachings herein can be used to provide multiple clock signal phases separated by relatively wide angular distances to amplification circuits of two or more adjacent phase-locked oscillators. Additionally, the amount of phase shift between the phase-locked oscillators can control the angular separation of the colocated clock signal phases available to the amplification circuits.

The teachings herein can be used, for example, to provide four or more physically colocated clock signal phases available for use by a multiphase oscillator's amplification circuits. In certain implementations, colocated clock signal phases are available along boundaries between adjacent phase-locked oscillators. The multiple clock signal phases permit the use of amplification circuits that provide enhanced performance by operating with multiple clock signal phases separated by wide angular distances, including, but not limited to, quadrature clock signals. The teachings herein can improve figure of merit (FOM) and/or phase noise (PN) of certain oscillators, including, for example, rotary travelling wave oscillators (RTWOs).

As used herein, "adjacent" multiphase oscillators can refer to oscillators implemented in separate layouts positioned physically next to or near one another and/or to oscillators implemented using shared or interwoven layouts. For example, in an RTWO configuration, adjacent RTWOs can include interwoven conductors, such as those described in commonly-owned U.S. patent application Ser. No. 13/341,995, published as U.S. Patent Publication No. 2012/0319783 on Dec. 20, 2012, and titled "INDUCTANCE ENHANCED ROTARY TRAVELING WAVE OSCILLATOR CIRCUIT AND METHOD," which is hereby incorporated by reference in its entirety herein.

Figure 1A:
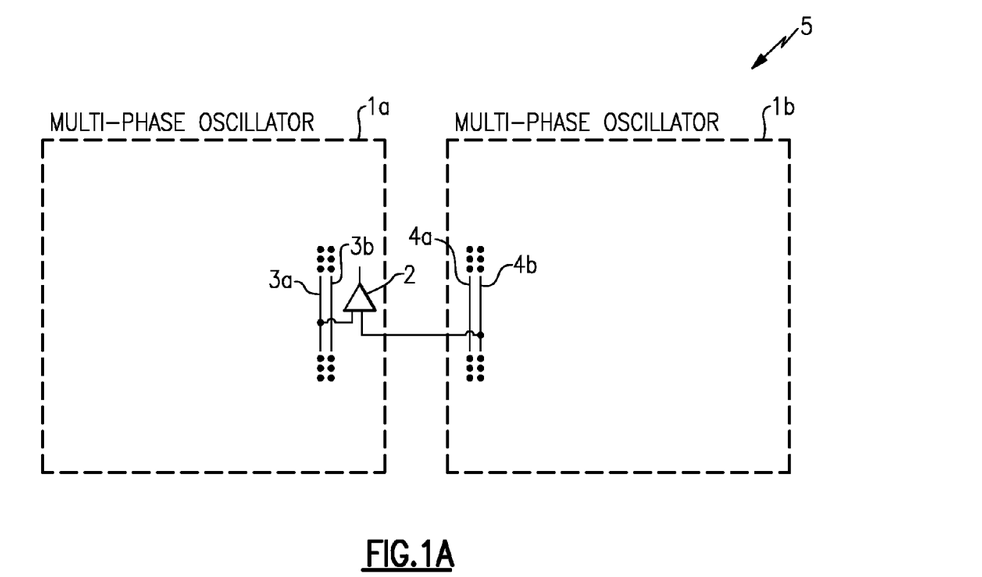
FIG. 1A is a schematic diagram of one embodiment of an oscillator system.

FIG. 1A is a schematic diagram of one embodiment of an oscillator system 5. The oscillator system 5 includes a first multiphase oscillator 1a and a second multiphase oscillator 1b. The first multiphase oscillator 1a includes a first pair of differential conductors 3a, 3b and an amplification circuit 2, and the second multiphase oscillator 1b includes a second pair of differential conductors 4a, 4b.

For clarity of the figures, the oscillator system 5 is shown as including two multiphase oscillators. However, the oscillator system 5 can include additional multiphase oscillators, including, for example, 3 or more multiphase oscillators. Furthermore, for clarity of the figures, the first multiphase oscillator 1a is illustrated as including one amplification circuit, and the amplification circuits of the second multiphase oscillator 1b have been omitted from FIG. 1A. However, the first and second multiphase oscillators 1a, 1b can include additional amplification circuits. In one embodiment, the first and second multiphase oscillators 1a, 1b have a substantially identical oscillator circuit topology and/or layout.

The amplification circuit 2 can actively contribute to the operation of the first multiphase oscillator 1a. For example, in certain configurations, the first multiphase oscillator 1a can be implemented as a ring oscillator, and the amplification circuit 2 corresponds to one of the amplification circuits cascaded in the oscillator's ring or loop. In another example, the first multiphase oscillator 1a can be implemented as an RTWO, and the amplification circuit 2 can be included in one of multiple regeneration circuits used to provide energy to a traveling wave of the RTWO.

In the illustrated configuration, the first and second multiphase oscillators 1a, 1b are locked in phase and frequency. The first and second multiphase oscillators 1a, 1b can be phase-locked in a variety of ways. For example, in certain implementations, the first and/or second conductors 3a, 3b of the first multiphase oscillator 1a can be electrically connected to the first and/or second conductors 4a, 4b of the second multiphase oscillator 1b to phase lock the oscillators with a desired amount of phase shift. Although one configuration of phase-locking the first and second multiphase oscillators 1a, 1b has been described, the first and second multiphase oscillators 1a, 1b can be phase-locked using any suitable configuration, including, for example, configurations that phase-lock the oscillators using passive and/or active circuitry and/or configurations that phase-lock the oscillators by coupling the oscillator's magnetic and/or electrical fields.

The amplification circuit 2 includes a first input configured to receive a first clock signal phase from the first conductor 3a of the first multiphase oscillator 1a and a second input configured to receive a second clock signal phase from the second conductor 4b of the second multiphase oscillator 1b. However, other configurations are possible, including, for example, implementations in which the amplification circuit 2 receives additional clock signal phases from the first and/or second multiphase oscillators 1a, 1b.

The phase shift between the first and second multiphase oscillators 1a, 1b can be used to control a phase difference between the first and second clock signal phases received by the amplification circuit 2. For example, during operation of the oscillator system 5, clock signals on the first and second conductors 3a, 3b of the first multiphase oscillator 1a can have a phase difference of about 180°, and clock signals on the first and second conductors 4a, 4b of the second multiphase oscillator 1b can also have phase difference of about 180°. Accordingly, when the second multiphase oscillator 1b is phase-locked to the first multiphase oscillator 1a with a phase shift θ, the first and second conductors 3a, 3b of the first multiphase oscillator 1a can provide clock signal phases of about 0° and about 180°, respectively, and the first and second conductors 4a, 4b of the second multiphase oscillator 1b can provide clock signal phases of about $(0+θ)°$ and about $(180+θ)°$, respectively. In this example, a reference point for clock signal phase has been chosen local to the amplification circuit 2 for clarity. However, skilled artisans will appreciate that clock signal phase can be defined relative to other reference points.

Accordingly, by locking the first and second multiphase oscillators 1a, 1b by a particular amount of phase shift θ, desired clock signal phases can be provided locally to the oscillators' amplification circuits. For instance, in a first example, the phase shift θ can be selected to be about equal to 90° such that the first and second conductors 3a, 3b of the first multiphase oscillator 1a provide clock signal phases of about 0° and about 180°, respectively, and the first and second conductors 4a, 4b of the second multiphase oscillator 1b provide clock signal phases of about 90° and 270°, respectively. Thus, in this example, quadrature clock signals would be locally available for amplification circuits disposed near a boundary between the first and second multiphase oscillators 1a, 1b. In another example, the phase shift θ can be selected to be about equal to 60° such that the first and second conductors 3a, 3b of the first multiphase oscillator 1a provide clock signal phases of about 0° and about 180°, respectively, and the first and second conductors 4a, 4b of the second multiphase oscillator 1b provide clock signal phases of about 60° and about 240°, respectively.

Although two example values of the phase shift θ between the first and second multiphase oscillators 1a, 1b has been provided for illustration, other values of the phase shift θ can be used. In one embodiment, the phase shift θ is selected to be in the range of about 15° and 345°.

Accordingly, locking the first and second multiphase oscillators 1a, 1b by a particular amount of phase shift θ can be used to colocate clock signal phases of wide angular separation for use by the oscillators' amplification circuits. Accordingly, amplification circuits, such as the amplification circuit 2 of the first multiphase oscillator 1a, can be implemented using high performance circuit topologies that operate using clock signal phases having wide angular separations without the need to route long wires to provide the desired clock signal phases.

Although FIG. 1A illustrates an amplification circuit of the first multiphase oscillator 1a operating using at least one clock signal phase generated by the first multiphase oscillator 1a and at least one clock signal phase generated by the second multiphase oscillator 1b, the second multiphase oscillator 1b can also include one or more amplification circuits that operate using a mix of clock signal phases generated by the first and second multiphase oscillators 1a, 1b. Furthermore, the first multiphase oscillator 1a can include one or more additional amplification circuits that operate using at least one clock signal phase generated by the first multiphase oscillator 1a and at least one clock signal phase generated by the second multiphase oscillator 1b.

Figure 1B:
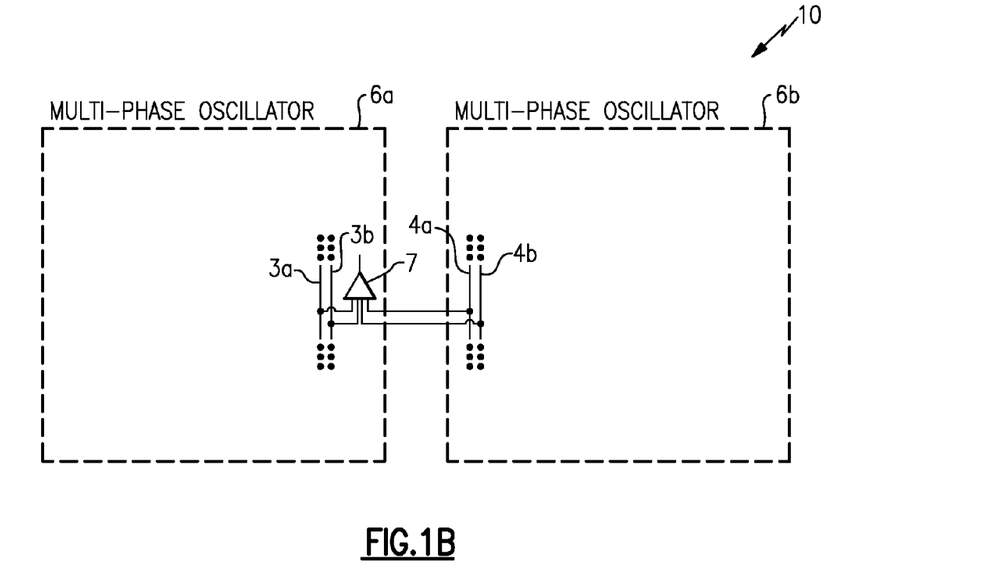
FIG. 1B is a schematic diagram of another embodiment of an oscillator system.

FIG. 1B is a schematic diagram of another embodiment of an oscillator system 10. The oscillator system 10 includes a first multiphase oscillator 6a and a second multiphase oscillator 6b. The first multiphase oscillator 6a includes a first pair of differential conductors 3a, 3b and an amplification circuit 7, and the second multiphase oscillator 6b includes a second pair of differential conductors 4a, 4b.

Although not illustrated in FIG. 1B for clarity, the first multiphase oscillator 6a can include additional amplification circuits, and the second multiphase oscillator 6b can include amplifications circuits that are not shown. For example, the first and second multiphase oscillators 6a, 6b can each include amplification circuits implemented in a ring oscillator configuration, in an RTWO configuration, or in any other suitable oscillator configuration.

The oscillator system 10 of FIG. 1B is similar to the oscillator system 5 of FIG. 1A, except that the oscillator system 10 illustrates a configuration in which the first multiphase oscillator 6a includes the amplification circuit 7, which operates using four clock signal phases.

In certain configurations described herein, an amplification circuit for an oscillator operates using at least two clock signal phases from a first multiphase oscillator and using at least at least two clock signal phase phased from a second multiphase oscillator that is physically adjacent to the first multiphase oscillator. For example, in the illustrated configuration, the amplification circuit 7 includes a first pair of inputs for receiving first and second clock signals from the first multiphase oscillator's first and second conductors 3a, 3b, respectively, and a second pair of inputs for receiving third and fourth clock signals from the second multiphase oscillator's first and second conductors 4a, 4b, respectively.

The amplification circuit 7 can operate using clock signal phases having a wide angular separation. For example, when the first and second multiphase oscillators 6a, 6b are phase-locked with a phase difference of about 90°, the amplification circuit 7 can receive local clock signals of about 0°, about 90°, about 180°, and about 270°. Although one example of a value of a phase shift has been provided, other values are possible. For example, in one embodiment, the first and second multiphase oscillators 6a, 6b are phase-locked to have a phase shift θ that is selected to be in the range of about 15° and 345°.

Additional details of the oscillator system 10 can be similar to those described earlier.

Although FIGS. 1A and 1B illustrate configurations of amplification circuits that operate using two clock signal phases and four clock signal phases, respectively, the teachings herein are applicable to configurations using amplification circuits that operate using other numbers of clock signal phases, including, for example, three clock signal phase, or five or more clock signal phases.

Figure 2:
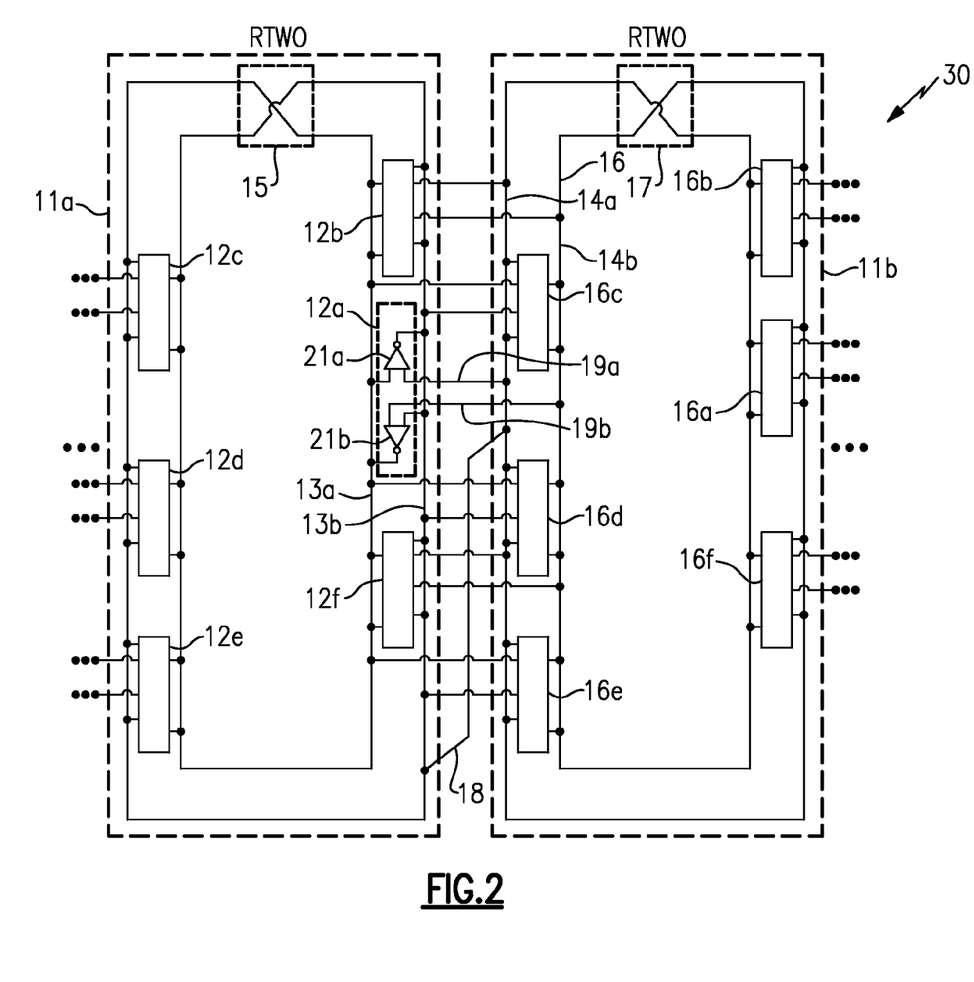
FIG. 2 is a schematic diagram of a rotary traveling wave oscillator (RTWO) system according to one embodiment.

FIG. 2 is a schematic diagram of a rotary traveling wave oscillator (RTWO) system 30 according to one embodiment. The RTWO system 30 includes a first RTWO 11a and a second RTWO 11b. The first RTWO 11a includes a first differential transmission line including a first conductor 13a and a second conductor 13b. The first RTWO 11a further includes a cross-over 15 and first to sixth regeneration circuits 12a-12f. The second RTWO 11b includes a second differential transmission line including a first conductor 14a and a second conductor 14b. The second RTWO 11b further includes a cross-over 17 and first to sixth regeneration circuits 16a-16f.

As persons having ordinary skill in the art will appreciate, an RTWO can include a differential transmission line connected in a closed loop, an odd number of one or more cross-overs, and a plurality of regeneration circuits electrically connected along a path of the differential transmission line. Additionally, each of the cross-overs can reverse the polarity of a wave propagating along the differential transmission line, and the regeneration circuits can provide energy to the wave to compensate for the differential transmission line's losses. Additional details of RTWOs can be as described in U.S. Pat. No. 6,556,089, which was incorporated by reference in its entirety earlier.

In the illustrated configuration, the first and second RTWOs 11a, 11b each include one cross-over and six regeneration circuits. However, other configurations are possible, including, for example, configurations using a different number of cross-overs and/or more or fewer regeneration circuits. Furthermore, although FIG. 2 illustrates the RTWO system 30 as including two RTWOs, the RTWO system 30 can include additional RTWOs and/or other circuitry.

As shown in FIG. 2, a phase-locking conductor 18 electrically connects a portion of the second conductor 13b of the first RTWO 11a and a portion of the first conductor 14a of the second RTWO 11b. In the illustrated configuration, a phase difference between the first and second RTWOs 11a, 11b can be controlled by selecting a position on the second conductor 13b and a position on the first conductor 14a between which the phase-locking conductor 18 connects. However, other configurations are possible, including, for example, implementations in which the first and second RTWOs 11a, 11b are phase-locked in other ways.

As illustrated in FIG. 2, the first regeneration circuit 12a of the first RTWO 11a includes first and second amplification circuits 21a, 21b. Although not illustrated in FIG. 2 for clarity, the second to sixth regeneration circuits 12b-12f of the first RTWO 11a and the first to sixth regeneration circuits 16a-16f of the second RTWO 11b can also include similar amplification circuits.

The first amplification circuit 21a includes a first input that receives a first clock signal phase from the first conductor 13a of the first RTWO 11a, a second input that receives a second clock signal phase from the first conductor 14a of the second RTWO 11b, and an output electrically connected to the second conductor 13b of the first RTWO 11a. Additionally, the second amplification circuit 21b includes a first input that receives a third clock signal phase from the second conductor 13b of the first RTWO 11a, a second input that receives a fourth clock signal phase from the second conductor 14b of the second RTWO 11b, and an output electrically connected to the first conductor 13a of the first RTWO 11a.

The amount of phase shift provided by the phase-locking conductor 18 can be used to control a phase difference between the first, second, third, and fourth clock signal phases received by the first regeneration circuit 12a. For example, when the phase-locking conductor 18 provides a phase shift θ between the first and second RTWOs 11a, 11b, the first amplification circuit 21a can receive clock signal phases of about 0° and about (0+θ)°, and the second amplification circuit 21b can receive clock signal phases of about 180° and about (180+θ)°.

As shown in FIG. 2, first and second conductors 19a, 19b have been used to provide the first regeneration circuit 12a of the first RTWO 11a with two clock signal phases from the second RTWO 11b. The first and second conductors 19a, 19b can have a relatively short length relative to a configuration in which the first regeneration circuit 12a receives clock signals of similar phases by routing relatively long metal wires within the first RTWO 11a.

Additional details of the oscillator system 30 of FIG. 2 can be similar to those described earlier.

Figure 3:
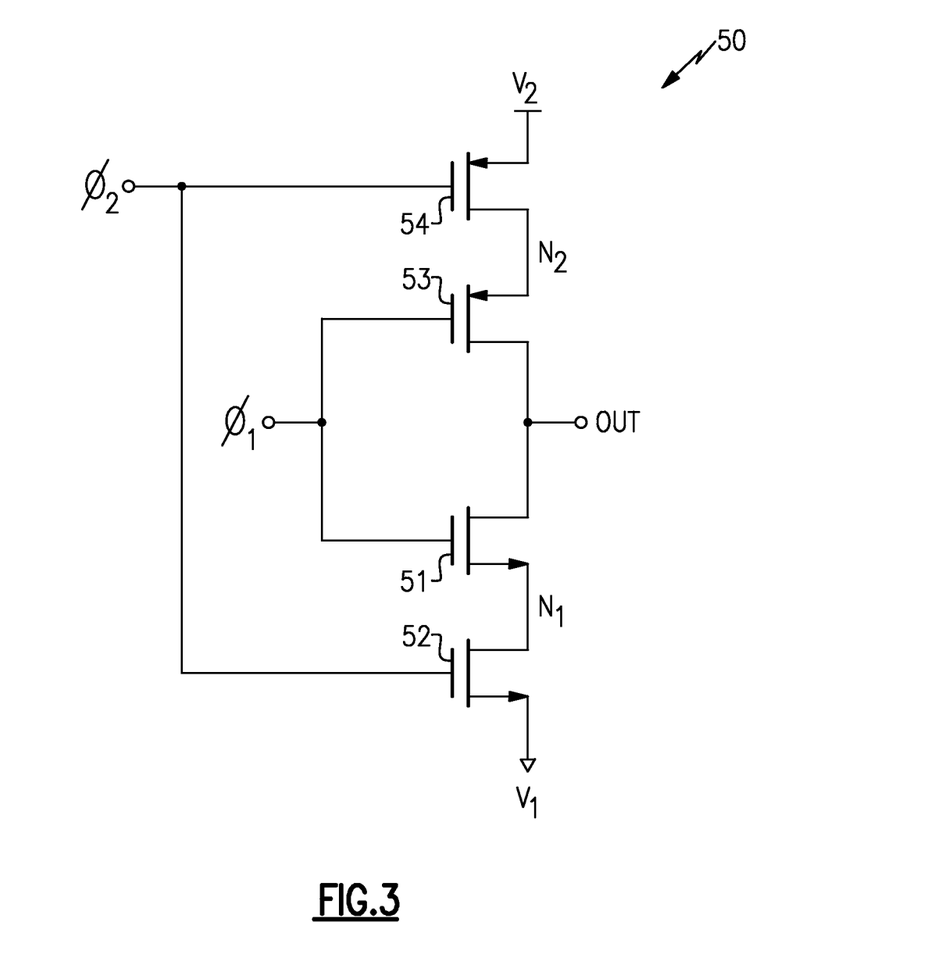
FIG. 3 is a circuit diagram of one implementation of an amplification circuit.

FIG. 3 is a circuit diagram of one implementation of an amplification circuit 50. The amplification circuit 50 includes a first n-type field effect transistor (NFET) 51, a second NFET 52, a first p-type field effect transistor (PFET) 53, and a second PFET 54. The amplification circuit 50 includes a first clock signal input φ1, a second clock signal input φ2, and an output OUT. The amplification circuit 50 illustrates one example of an amplification circuit that can be used to implement the first and/or second amplification circuits 21a, 21b of FIG. 2. However, other configurations of amplification circuits can be used.

The first NFET 51 includes a gate electrically connected to the first clock signal input φ1, a source electrically connected to a drain of the second NFET 52 at a first node $N_1$, and a drain electrically connected to the output OUT. Additionally, the second NFET 52 further includes a gate electrically connected to the second clock signal input φ2 and a source electrically connected to a first or low supply voltage $V_1$. The first PFET 53 includes a gate electrically connected to the first clock signal input φ1, a source electrically connected to a drain of the second PFET 54 at a second node $N_2$, and a drain electrically connected to the output OUT. The second PFET 54 further includes a gate electrically connected to the second clock signal input φ2 and a source electrically connected to a second or high supply voltage $V_2$.

The amplification circuit 50 can be used to provide energy to a traveling wave in response to both rising and falling edges of the wave. For example, the second clock signal input φ2 can receive a clock signal phase that is earlier in time relative to a clock signal phase received on the first clock signal input φ1. Before arrival of a rising edge of a traveling wave, the first and second PFETs 53, 54 can be turned on, the first and second NFETs 51, 52 can be turned off, and the second node $N_2$ can be pre-charged to a voltage level of the high supply voltage $V_2$. Additionally, the rising edge of the traveling wave can reach the second clock signal input φ2 before reaching the first clock signal input φ1, thereby turning off the second PFET 54 and turning on the second NFET 52. Thereafter, the wave's rising edge can reach the first clock signal input φ1, and a conductive path supplying energy to the wave can be provided between the low supply voltage $V_1$ and the output terminal OUT through the first and second NFETs 51, 52. However, since the wave's rising edge can turn off the second PFET 54 before turning on the first NFET 51, the amplification circuit 50 can eliminate or reduce crow-bar current relative to an inverter configuration, and thus can have reduced phase noise and/or lower power dissipation.

Similarly, before arrival of a falling edge of the traveling wave, the first and second PFETs 53, 54 can be turned off, the first and second NFETs 51, 52 can be turned on, and the first node $N_1$ can be pre-charged to a voltage level of the low supply voltage $V_1$. Additionally, the falling edge of the traveling wave can reach the second clock signal input φ2 before reaching the first clock signal input φ1, thereby turning off the second NFET 52 and turning on the second PFET 54. Thereafter, the wave's falling edge can reach the first clock signal input φ1, and a conductive path supplying energy to the wave can be provided between the high supply voltage $V_2$ and the output terminal OUT through the first and second PFETs 53, 54. However, since the wave's falling edge can operate to turn off the second NFET 52 before turning on the first PFET 53, the amplification circuit 50 can eliminate or reduce crow-bar current relative to an inverter configuration.

With reference to FIGS. 2 and 3, the first and second amplification circuits 21a, 21b of the first regeneration circuit 12a can operate using clock signal phases having a relatively wide angular separation. For example, when the first and second amplification circuits 21a, 21b of FIG. 2 are implemented using the amplification circuit 50 shown in FIG. 3, it can be desirable for the first and second clock signal inputs φ1, φ2 to have a relatively wide angular separation, for example, a quadrature phase relationship.

When using a single RTWO in an oscillator system, clock signal phases can be provided to each regeneration circuit by routing long wires within the RTWO. However, the long wires can also cause losses and reduce the RTWO's Q-factor and/or otherwise degrade the RTWO's performance. In contrast, the RTWO system of FIG. 2 includes amplification circuits that operate using a first clock signal phase from a first RTWO and that operate using a second clock signal phase from a second RTWO. The first and second RTWOs are phase-locked by a phase shift amount selected to provide clock signal phases of sufficient angular separation to the RTWOs' amplification circuits.

Figure 4:
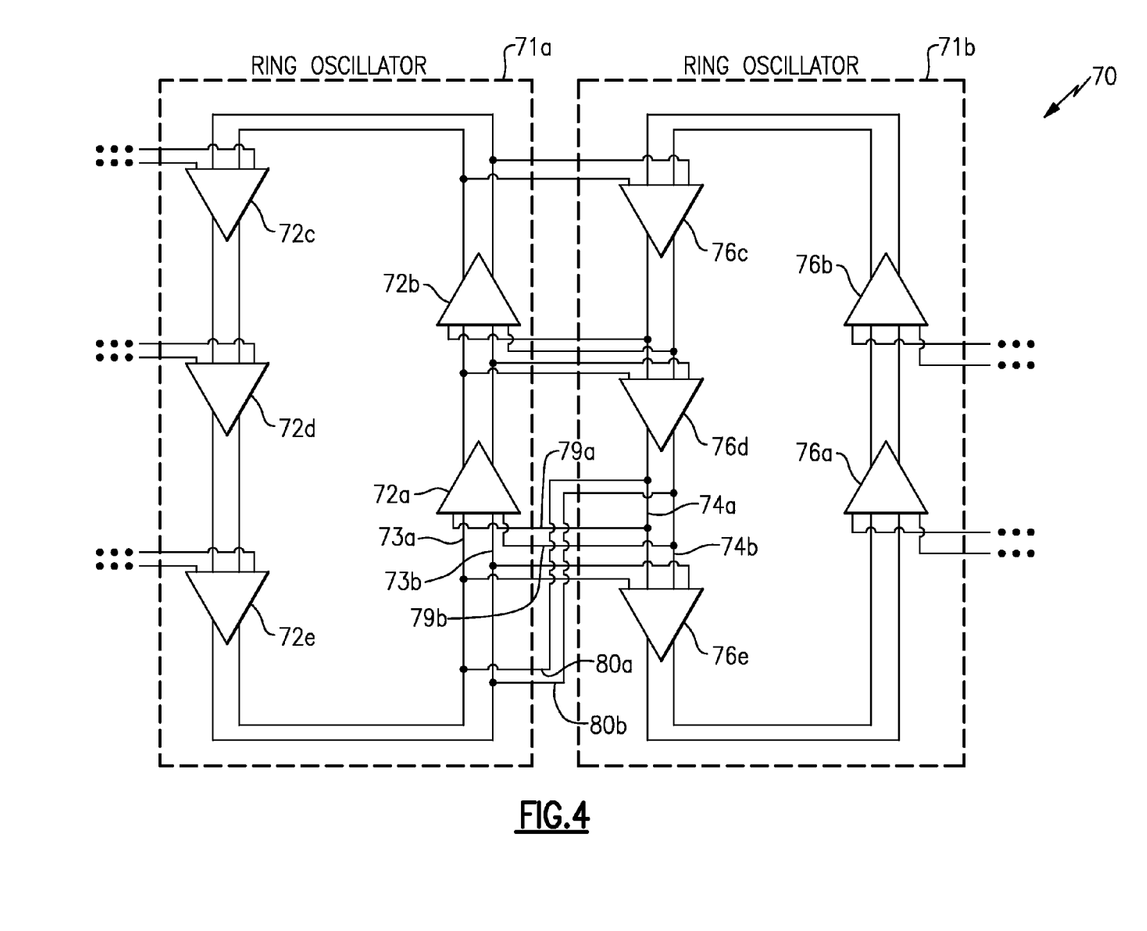
FIG. 4 is a schematic block diagram of a ring oscillator system according to one embodiment.

FIG. 4 is a schematic block diagram of a ring oscillator system 70 according to one embodiment. The ring oscillator system 70 includes a first ring oscillator 71a and a second ring oscillator 71b. The first ring oscillator 71a includes first to fifth amplification circuits 72a-72e and a pair of conductors including a first conductor 73a and a second conductor 73b. The second ring oscillator 71b includes first to fifth amplification circuits 76a-76e and a pair of conductors including a first conductor 74a and a second conductor 74b. As shown in FIG. 4, the first to fifth amplification circuits 72a-72e are cascaded in a ring or loop of the first ring oscillator 71a, and the first to fifth amplification circuits 76a-76e are cascaded in a ring of the second ring oscillator 71b.

Although the first and second ring oscillators 71a, 71b are illustrated as including five amplification circuits, the ring oscillators can include more or fewer amplification circuits. Additionally, although the first and second ring oscillators 71a, 71b are illustrated as including an odd number of amplification circuits, the teachings herein are applicable to configurations using an even number of amplification circuits, such as implementations in which signal inversion in the ring oscillator's loop is provided using a cross-over of the oscillator's conductors. Furthermore, although FIG. 4 illustrates the ring oscillator system 70 as including two ring oscillators, the ring oscillator system 70 can include additional ring oscillators and/or other circuitry.

As shown in FIG. 4, a pair of phase-locking conductors 80a, 80b have been used to electrically connect portions of the first ring oscillator's conductors 73a, 73b to portions of the second ring oscillator's conductors 74a, 74b. The phase difference between the first and second ring oscillators 71a, 71b can be controlled by selecting the positions of the first and second ring oscillators' conductors between which the phase-locking conductors 80a, 80b connect. However, other configurations are possible, including, for example, implementations in which the first and second ring oscillators 71a, 71b are phase-locked in other ways.

As illustrated in FIG. 4, the first amplification circuit 72a of the first ring oscillator 71a includes a first input that receives a first clock signal phase from the first conductor 73a of the first ring oscillator 71a, a second input that receives a second clock signal phase from the second conductor 73b of the first ring oscillator 71a, a third input that receives a third clock signal phase from the first conductor 74a of the second ring oscillator 71b, and a fourth input that receives a fourth clock signal phase from the second conductor 74b of the second ring oscillator 71b. Thus, in the illustrated configuration, the first amplification circuit 72a operates using four clock signal phases, two of which are provided from the first ring oscillator 71a and two of which are provided from the second ring oscillator 71b. Similarly, the second amplification circuit 72b of the first ring oscillator 71a and the third to fifth ring oscillators 76c-76e of the second ring oscillator 71b receive two clock signal phases from each of the first and second ring oscillators 71a, 71b.

The amount of phase shift provided between the first and second ring oscillators 71a, 71b can be used be used to control a phase difference between the first, second, third, and fourth clock signal phases received by the first amplification circuit 72a. For example, when the phase-locking conductors 80a, 80b provide a phase shift θ between the first and second ring oscillators 71a, 71b, the first amplification circuit 72a can receive clock signal phases of about 0°, about (0+θ)°, about 180°, and about (180+θ)°.

As shown in FIG. 4, the third to fifth amplification circuits 72c-72e of the first ring oscillator 71a each receive two clock signal phases from the first ring oscillator 71a. In certain configurations, the ring oscillator system 70 includes an additional ring oscillator positioned adjacent a left side of the first ring oscillator 71a, and the additional ring oscillator provides the third to fifth amplification circuits 72c-72e with two additional clock signal phases. In other configurations, two additional clock signal phases are provided to the third to fifth amplification circuits 72c-72e by routing wires within the first ring oscillator 71a to provide the desired clock signal phases. Furthermore, as shown in FIG. 4, the first and second amplification circuits 76a, 76b of the second ring oscillator 71b each receive two clock signal phases from the second ring oscillator 71b. In certain configurations, the ring oscillator system 70 includes an additional ring oscillator positioned adjacent a right side of the second ring oscillator 71b, and the additional ring oscillator provided the first and second amplification circuits 76a, 76b with two additional clock signal phases. In other configurations, two additional clock signal phases are provided to the first and second amplification circuits 76a, 76b by routing wires within the second ring oscillator 71b to provide the desired clock signal phases.

Additional details of the ring oscillator system 70 can be similar to those described earlier.

Figure 5A:
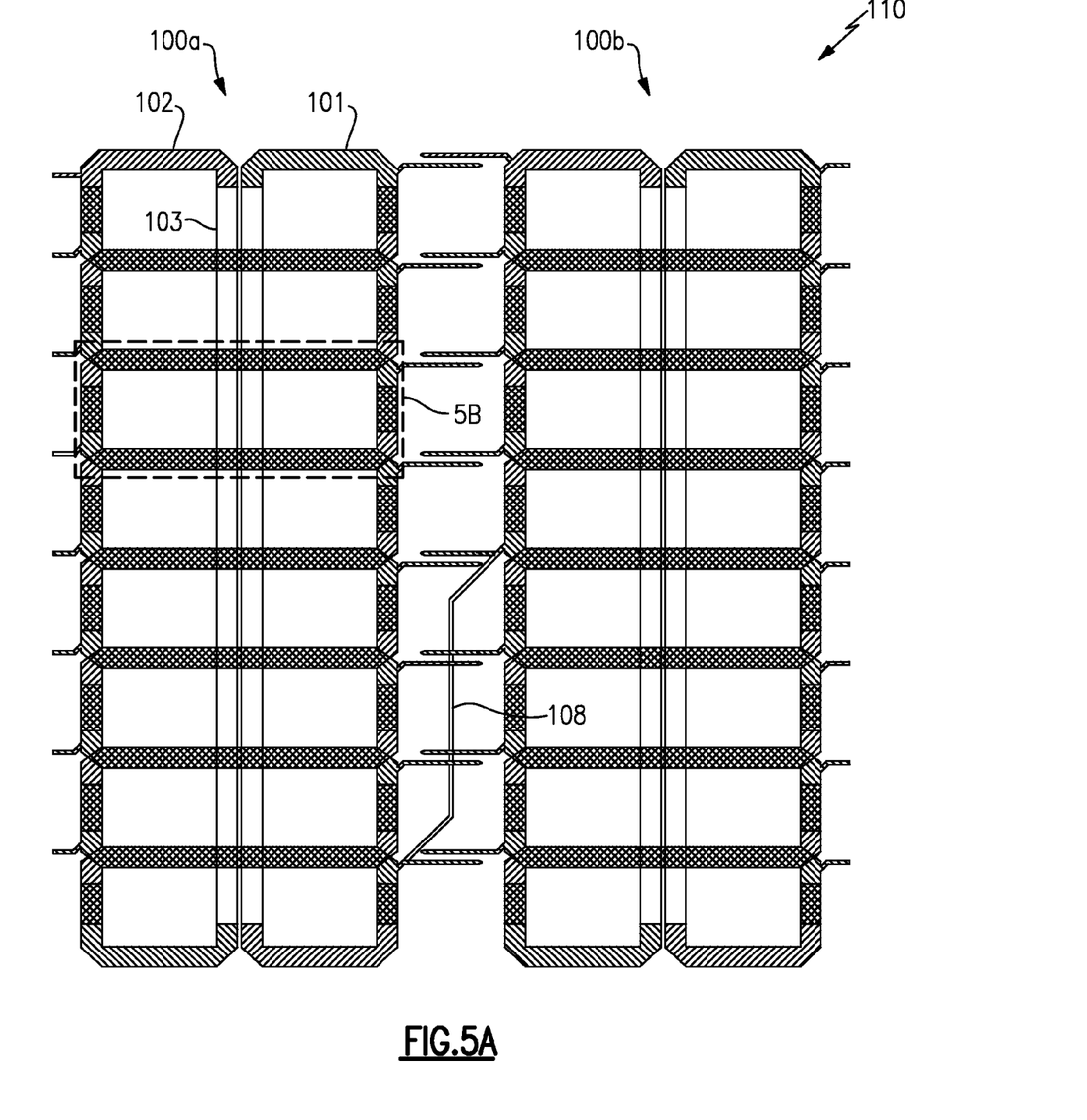
FIG. 5A is a schematic diagram of a conductor layout of an RTWO system according to one embodiment.

FIG. 5A is a schematic diagram of a conductor layout 110 of an RTWO system according to one embodiment.

The conductor layout 110 illustrates conductors for a first RTWO 100a and a second RTWO 100b. Although not illustrated in FIG. 5A for clarity, the first and second RTWOs 100a, 100b include additional structures, for example, regeneration circuits. The conductor layout 100 includes an example layout of a first metal layer (MET1) 101, a second metal layer (MET2) 102, and a third metal layer (MET3) 103.

Figure 5B:
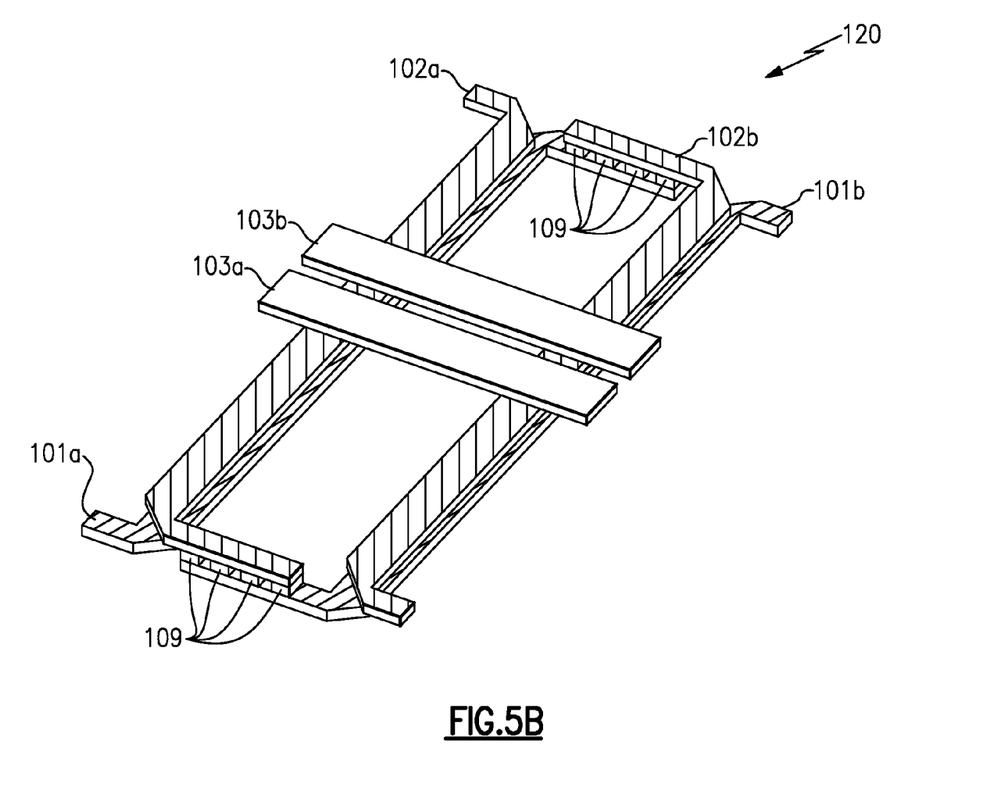
FIG. 5B is a schematic diagram of a portion of the conductor layout of FIG. 5A.

FIG. 5B is a schematic diagram of a portion 120 of the conductor layout 110 of FIG. 5A shown in the dashed box 5B of FIG. 5A. The portion 120 of the conductor layout 110 includes a first MET1 region 101a, a second MET1 region 101b, a first MET2 region 102a, a second MET2 region 102b, a first MET3 region 103a, a second MET3 region 103b, and vias 109.

As shown in FIG. 5B, the first MET1 region 101a is electrically connected to the second MET2 region 102b using the vias 109. Additionally, the first MET2 region 102a is electrically connected to the second MET1 region 101b using the vias 109. The illustrated differential transmission line configuration includes conductors that have a relatively large amount of overlap to provide magnetic fields that constructively add when a wave propagates along the differential transmission line. In particular, when a wave travels along the illustrated differential transmission line, currents flowing through the first MET1 region 101a and the first MET2 region 102a can flow in the same direction. Likewise, currents flowing through the second MET1 region 101b and the second MET2 region 102b can flow in the same direction. Configuring the differential transmission line to include portions in which currents flow through the transmission line's conductors in the same direction can increase the transmission line's inductance and characteristic impedance, thereby reducing the power of a wave traveling on the transmission line and/or enhancing Q-factor.

The conductor layout 110 can be used to provide differential clock signals at positions along the first and second RTWOs 100a, 100b. For example, corresponding positions of the first MET1 region 101a and the first MET2 region 102a can be associated with a phase difference of about 180°. Similarly, corresponding positions of the second MET1 region 101b and the second MET2 region 102b can be associated with a phase difference of about 180°. Furthermore, corresponding positions of the first MET3 region 103a and the second MET3 region 103b can be associated with a phase difference of about 180°.

Thus, clock signal phases of about 0° and 180° can be available to the RTWOs' regeneration circuits that are disposed along the RTWOs' differential transmission line. However, within a particular RTWO, clock signal phases of wide angular separation relative to the clock signal phases of about 0° and 180° can be physically distant. To provide clock signal phases of wide angular distance, such as clock signal phases having a quadrature phase relationship, the first and second RTWOs 100a, 100b can be phase-locked, such as by using the phase-locking conductor 108. Additionally, the first RTWO 100a can include at least one regeneration circuit that operates using at least one clock signal phase generated by the first RTWO 100a and at least one clock signal phase generated by the second RTWO 100b. Similarly, the second RTWO 100b can include at least one regeneration circuit that operates using at least one clock signal phase generated by the first RTWO 100a and at least one clock signal phase generated by the second RTWO 100b. Additional details of the first and second RTWOs 100a, 100b can be as described earlier.

Figure 6A:
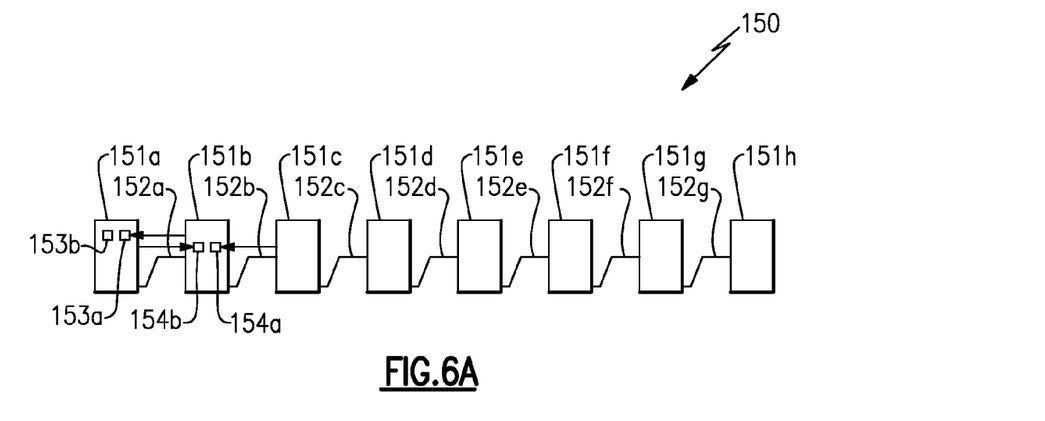
FIG. 6A is a schematic diagram of another embodiment of an oscillator system.

FIG. 6A is a schematic diagram of another embodiment of an oscillator system 150.

The oscillator system 150 includes first to eighth multiphase oscillators 151a-151h and first to seventh phase-locking conductors 152a-152g. As shown in FIG. 6A, the second multiphase oscillator 151b is phase-locked to the first multiphase oscillator 151a using the first phase-locking conductor 152a. Similarly, the third to eighth multiphase oscillators 151c-151h are phase-locked to the second to seventh multiphase oscillators 151b-151g, respectively, using the second to seventh phase-locking conductors 152b-152g.

In the illustrated configuration, the first to eighth multiphase oscillators 151a-151h have been arranged side-by-side in a parallel configuration. Additionally, adjacent multiphase oscillators have been phase-locked. Although the illustrated oscillator system 150 includes eight multiphase oscillators, the oscillator system 150 can include more or fewer oscillators.

Certain amplification circuits of the multiphase oscillators have been illustrated in FIG. 6A. For example, the first multiphase oscillator 151a is illustrated as including a first amplification circuit 153a and a second amplification circuit 153b, and the second multiphase oscillator 152b is illustrated as including a first amplification circuit 154a and a second amplification circuit 154b. Although not illustrated in FIG. 6A for clarity, the first to eighth multiphase oscillators can include additional amplification circuits.

The first amplification circuit 153a of the first multiphase oscillator 151a operates using at least one clock signal phase generated by the first multiphase oscillator 151a and using at least one clock signal phase generated by the second multiphase oscillator 151b. Additionally, the first amplification circuit 154a of the second multiphase oscillator 151b operates using at least one clock signal phase generated by the third multiphase oscillator 151c and using at least one clock signal phase generated by the second multiphase oscillator 151b. Additionally, the second amplification circuit 154b of the second multiphase oscillator 151b operates using at least one clock signal phase generated by the first multiphase oscillator 151a and using at least one clock signal phase generated by the second multiphase oscillator 151b.

However, in the configuration shown in FIG. 6A, the second amplification circuit 153b of FIG. 6A operates using only clock signal phases generated by the first multiphase oscillator 151a. The clock signal phases can be provided, for example, by routing wires within the first multiphase oscillator 151a to provide the desired clock signal phases. Although routing wires can reduce the Q-factor or otherwise degrade the performance of the first multiphase oscillator 151a, the overall impact on the performance of the oscillator system 150 can be relatively small. For example, in the illustrated configuration, amplification circuits disposed along 14 lateral sides of the multiphase oscillators can receive clock signal phases from adjacent multiphase oscillators, while amplification circuits disposed along 2 lateral sides of the multiphase oscillators can have no adjacent multiphase oscillator.

Figure 6B:
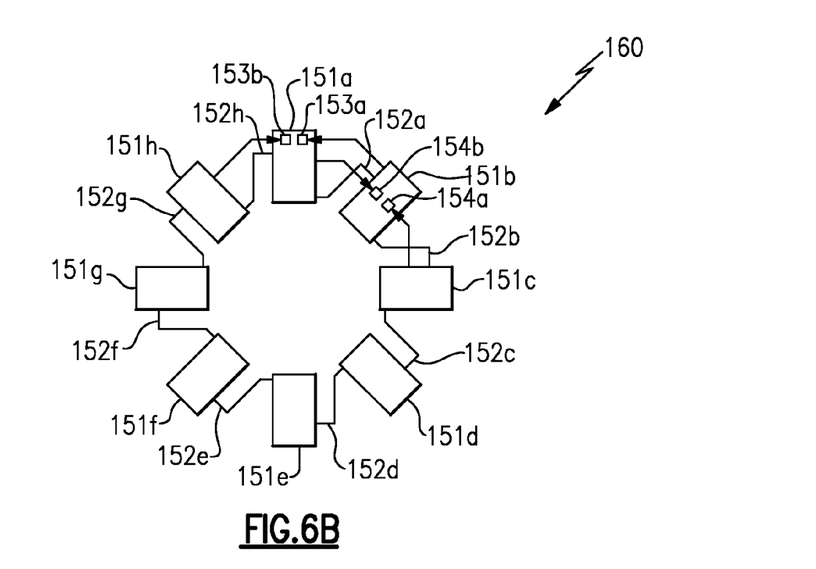
FIG. 6B is a schematic diagram of another embodiment of an oscillator system.

FIG. 6B is a schematic diagram of another embodiment of an oscillator system 160. The oscillator system 160 includes first to eighth multiphase oscillators 151a-151h and first to eighth phase-locking conductors 152a-152h.

The oscillator system 160 of FIG. 6B is similar to the oscillator system 150 of FIG. 6A, except that the oscillator system 160 includes multiphase oscillators implemented in a circular configuration rather than a side-by-side configuration, and the oscillator system 160 further includes the eighth phase-locking conductor 152h.

As shown in FIG. 6B, the first multiphase oscillator 151a is phase-locked to the eighth multiphase oscillator 151h using the eighth phase-locking conductor 152h. As shown in FIG. 6B, the second amplification circuit 153b of the first multiphase oscillator 151a operates using at least one clock signal phase provided by the eighth multiphase oscillator 151h and using at least one clock signal phase provided by the first multiphase oscillator 151a.

Implementing multiphase oscillators in a circular configuration can aid in increasing a number of amplification circuits that can receive clock signal phases from adjacent multiphase oscillators. However, implementing an oscillator system in this manner can also increase overall layout area relative to a side-by-side configuration. Additional details of the oscillator system 160 can be similar to those described earlier.

APPLICATIONS

Devices employing the above described schemes can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
a plurality of rotary traveling wave oscillators (RTWOs) comprising:
a first RTWO configured to generate a first clock signal having a first phase, wherein the first RTWO comprises a first plurality of regeneration circuits, wherein the first clock signal is generated in part using the first plurality of regeneration circuits; and
a second RTWO adjacent the first RTWO, wherein the second RTWO is configured to generate a second clock signal having a second phase different than the first phase, wherein a phase of the second RTWO is phase locked to the first RTWO with a phase shift, wherein a first regeneration circuit of the first plurality of regeneration circuits is configured to operate at least with the first clock signal generated by the first RTWO and the second clock signal generated by the second RTWO.

2. The apparatus of claim 1, wherein the second RTWO comprises a second plurality of regeneration circuits, wherein a first regeneration circuit of the second plurality of regeneration circuits is configured to operate at least with one clock signal generated by the first RTWO and one clock signal generated by the second RTWO.

3. The apparatus of claim 1, wherein the phase shift is selected to be in the range of about 15° and 345°.

4. The apparatus of claim 1, wherein the first regeneration circuit is positioned adjacent a boundary between the first and second RTWOs.

5. The apparatus of claim 1, wherein the plurality of RTWOs are arranged in a side-by-side configuration.

6. The apparatus of claim 1, wherein the plurality of RTWOs are arranged in a circular configuration.

7. The apparatus of claim 1, further comprising a phase-locking conductor configured to phase lock the second RTWO to the first RTWO.

8. The apparatus of claim 1, wherein the first RTWO is further configured to generate a third clock signal having a third phase, wherein the second RTWO is further configured to generate a fourth clock signal having a fourth phase, and wherein the first regeneration circuit is further configured to operate with the third clock signal and with the fourth clock signal.

9. The apparatus of claim 8, wherein the first clock signal, the second clock signal, the third clock signal, and the fourth clock signal have a substantially quadrature relationship.

10. The apparatus of claim 1, wherein the first RTWO further comprises:
a differential transmission line in a closed loop, the differential transmission line including a first conductor, a second conductor, and an odd number of one or more cross-overs, wherein each of the one or more cross-overs is configured to reverse the polarity of a wave propagating along the differential transmission line, wherein the first plurality of regeneration circuits are electrically connected along a path of the differential transmission line, wherein the first plurality of regeneration circuits are configured to provide energy to the wave to compensate for losses associated with the differential transmission line.

11. The apparatus of claim 10, wherein when the wave propagates along the differential transmission line, a first current flows through the first conductor and a second current flows through the second conductor, and wherein the differential transmission line comprises a plurality of transmission line portions in which the first and second currents flow in a same direction to increase an inductance of the differential transmission line.

12. The apparatus of claim 1, wherein the first regeneration circuit comprises a first n-type FET and a second n-type FET electrically connected in series between a power low supply voltage and an output node of the first regeneration circuit, wherein the first regeneration circuit further comprises a first p-type FET and a second p-type FET electrically connected in series between a power high supply voltage and the output node, wherein a gate of the first n-type FET and a gate of the first p-type FET are configured to receive the first clock signal, and wherein a gate of the second n-type FET and a gate of the second p-type FET are configured to receive the second clock signal.

13. The apparatus of claim 1, further comprising a third RTWO adjacent the first RTWO, wherein a second regeneration circuit of the first plurality of regeneration circuits is configured to operate at least with one clock signal generated by the first RTWO and one clock signal generated by the third RTWO.

14. The apparatus of claim 1, wherein the first regeneration circuit comprises a first field-effect transistor (FET) and a second FET electrically connected in series, wherein a gate of the first FET is configured to receive the first clock signal, and wherein a gate of the second FET is configured to receive the second clock signal.

15. An apparatus comprising:
a plurality of multiphase oscillators comprising:
a first multiphase oscillator configured to generate a first clock signal having a first phase, wherein the first multiphase oscillator comprises a first plurality of amplification circuits, wherein the first clock signal is generated in part using the first plurality of amplification circuits;
a second multiphase oscillator adjacent the first multiphase oscillator, wherein the second multiphase oscillator is configured to generate a second clock Signal having a second phase different than the first phase, wherein a phase of the second multiphase oscillator is phase locked to the first multiphase oscillator with a phase shift, wherein a first amplification circuit of the first plurality of amplification circuits is configured to operate at least with the first clock signal generated by the first multiphase clock oscillator and the second clock signal generated by the second multiphase oscillator; and
a third multiphase oscillator adjacent the first multiphase oscillator, wherein a second amplification circuit of the first plurality of amplification circuits is configured to operate at least with one clock signal generated by the first multiphase oscillator and one clock signal generated by the third multiphase oscillator.

16. The apparatus of claim 15, wherein the first multiphase oscillator comprises a ring oscillator, wherein the first plurality of amplification circuits is cascaded in a loop of the ring oscillator.

17. The apparatus of claim 15, wherein the first multiphase oscillator comprises a first RTWO, wherein the second multiple phase oscillator comprises a second RTWO, and wherein the third multiphase oscillator comprises a third RTWO.

18. The apparatus of claim 15, further comprising a first phase-locking conductor configured to phase lock the second multiphase oscillator to the first multiphase oscillator.

19. An apparatus comprising:
a plurality of multiphase oscillators comprising:
   a first multiphase oscillator configured to generate a first clock signal having a first phase, wherein the first multiphase oscillator comprises a first plurality of amplification circuits, wherein the first clock signal is generated in part using the first plurality of amplification circuits;
   a second multiphase oscillator adjacent the first multiphase oscillator, wherein the second multiphase oscillator is configured to generate a second clock signal having a second phase different than the first phase, wherein a phase of the second multiphase oscillator is phase locked to the first multiphase oscillator with a phase shift,
   wherein a first amplification circuit of the first plurality of amplification circuits is configured to operate at least with the first clock signal generated by the first multiphase clock oscillator and the second clock signal generated by the second multiphase oscillator, wherein the first amplification circuit comprises a first field-effect transistor (FET) and a second FET electrically connected in series, wherein a gate of the first FET is configured to receive the first clock signal, and wherein a gate of the second FET is configured to receive the second clock signal.

20. An electronically-implemented method of electronic oscillation, the method comprising:
   generating a first clock signal having a first phase using a first rotary traveling wave oscillator (RTWO), wherein the first clock signal is generated in part using a first plurality of regeneration circuits of the first RTWO;
   generating a second clock signal having a second phase using a second RTWO, wherein the second phase is different than the first phase;
   phase locking the second RTWO to the first RTWO, oscillator, wherein phase locking occurs with a phase shift; and
   providing a first regeneration circuit of the first plurality of regeneration circuits at least with the first clock signal generated by the first RTWO and the second clock signal generated by the second RTWO.

21. The method of claim 20, further comprising:
   generating a third clock signal having a third phase using the first RTWO;
   generating a fourth clock signal having a fourth phase using the second RTWO, wherein the fourth phase is different than the third phase; and
   providing the first regeneration circuit with the third clock signal and the fourth clock signal.

22. An electronically-implemented method of electronic oscillation, the method comprising:
   generating a first clock signal having a first phase using a first multiphase oscillator, wherein the first clock signal is generated in part using a first plurality of amplification circuits of the first multiphase oscillator;
   generating a second clock signal having a second phase using a second multiphase oscillator, wherein the second phase is different than the first phase;
   phase locking the second multiphase oscillator to the first multiphase oscillator, wherein phase locking occurs with a phase shift;
   providing a first amplification circuit of the first plurality of amplification circuits at least with the first clock signal generated by the first multiphase clock oscillator and the second clock signal generated by the second multiphase oscillator;
   generating one or more clock signals using a third multiphase oscillator; and
   providing a second amplification circuit of the first plurality of amplification circuits at least with one clock signal generated by the first multiphase clock oscillator and one clock signal generated by the third multiphase oscillator.

23. The method of claim 22, wherein the second clock signal is generated in part using a second plurality of amplification circuits of the second multiphase oscillator, wherein the method further comprises providing a first amplification circuit of the second plurality of amplification circuits at least with one clock signal generated by the first multiphase clock oscillator and one clock signal generated by the third multiphase oscillator.

* * * * *